United States Patent [19]

Yamamoto et al.

[11] Patent Number: 4,911,512
[45] Date of Patent: Mar. 27, 1990

[54] WAVEGUIDE TYPE OPTICAL HEAD

[75] Inventors: Osamu Yamamoto, Nara; Hiroshi Hayashi, Soraku; Nobuyuki Miyauchi, Tenri; Shigeki Maei, Yamatokoriyama; Hidenori Kawanishi, Higashiosaka, all of Japan

[73] Assignee: Sharp Kabushiki Kaisha, Osaka, Japan

[21] Appl. No.: 117,690

[22] Filed: Nov. 5, 1987

[30] Foreign Application Priority Data

Nov. 5, 1986 [JP]  Japan ................... 61-264308

[51] Int. Cl.⁴ .............................................. G02B 6/12
[52] U.S. Cl. ................................. 350/96.11; 350/96.18
[58] Field of Search ............... 350/96.11, 96.12, 96.15, 350/96.20; 369/44-46

[56] References Cited

U.S. PATENT DOCUMENTS

| 4,156,206 | 5/1979 | Comerford et al. | 350/96.15 |
| 4,468,084 | 8/1984 | Hutcheson et al. | 350/96.11 |
| 4,529,876 | 7/1985 | Walker | 250/227 |
| 4,640,574 | 2/1987 | Unger | 350/96.12 |
| 4,718,052 | 1/1988 | Kondo et al. | 350/96.11 |
| 4,729,618 | 3/1988 | Yoshida et al. | 350/96.11 |
| 4,750,799 | 6/1988 | Kawachi et al. | 350/96.11 |
| 4,760,569 | 7/1988 | Mahlein | 350/96.11 |

FOREIGN PATENT DOCUMENTS

| 0174008 | 9/1985 | European Pat. Off. |  |
| 0206745 | 6/1986 | European Pat. Off. |  |
| 0187581 | 7/1986 | European Pat. Off. | 350/96.11 |
| 3632229 | 9/1986 | Fed. Rep. of Germany. |  |
| 58-111391 | 9/1983 | Japan. |  |
| 60-202553 | 3/1986 | Japan. |  |

OTHER PUBLICATIONS

K. North, "Integrated optical . . . ," *IBM Technical Disclosure Bulletin*, vol. 24, No. 2, Jul. 1981, pp. 893–894.

*Primary Examiner*—Frank Gonzalez
*Attorney, Agent, or Firm*—Birch, Stewart, Kolasch & Birch

[57] ABSTRACT

A waveguide type optical head comprises a thin film waveguide of semiconductor or dielectric substance formed on a semiconductor or dielectric substrate, an optical element with an optical signal processing function provided on the thin film waveguide, and a semiconductor laser fixed on the substrate for emitting laser beam into the waveguide, and is characterized in that part of the laser beam emitted from the semiconductor laser is reflected by the incident end surface of the thin film waveguide and returned to the semiconductor laser.

9 Claims, 2 Drawing Sheets

WAVEGUIDE TYPE OPTICAL HEAD

BACKGROUND OF THE INVENTION

The present invention relates to an optical sensor head and an optical pickup for use in optical measurement, optical information processing and various other fields.

As higher output and more reliable semiconductor lasers and more accurate and lighter optical components have been developed in recent years, various optical sensors and optical disc devices such as compact discs and laser discs have come to be put to practical use for optical measurement and optical information processing with laser beams. A waveguide type optical head for a smaller and has lighter system has been proposed and drawn attention.

FIG. 3 shows the basic construction of the conventional optical head proposed as an optical pickup for optical discs. A semiconductor laser 1 is secured on a submount 2 made of, for example, copper. The submount 2 is fixed on a metal mount 3. Current flow between an Au wire 4 and the mount 3 allows the semiconductor laser 1 to emit laser beams. A thin film waveguide element 8, composed of a silicon substrate 5, a $SiO_2$ buffer layer 6 formed by oxidation on the silicon substrate 5 and a glass waveguide layer 7 formed by sputtering on the buffer layer 6, is also fixed on the mount 3. On the waveguide layer 7 are formed a collimator lens 9, a beam splitter 10 and a focus grating coupler 11. Light beam emitted by the semiconductor laser 1 enters the waveguide layer 7 from one of the end faces thereof, is parallelized by the collimator lens 9 and concentrated by the focus grating coupler 11 as a spot 12 on a disc surface. Light reflected from the spot 12 returns through the focus grating coupler 11 into the waveguide and is redirected by the beam splitter 10 to an optical sensor 13 located on one side of the waveguide so that information recorded in the disc is read.

The collimator lens 9, the beam splitter 10 and the focus grating coupler 11 are susceptible to wavelength variation of the light source. The angle of reflection changes with the wavelength, causing the focal point 12 to deviate largely from the setting. Since an ordinary semiconductor laser emits laser beams of oscillation wavelength changing continuously or intermittently with the driving current and/or the room temperature, the proposed conventional optical head is not suitable for an optical pickup.

Furthermore, the light reflected from the end face of the waveguide (made up of glass, $SiO_2$ and Si substrate) returns to the semiconductor laser, causing the oscillation wavelength of the semiconductor laser to change due to the following reason. That is, the laser beam reflected back from the waveguide end face to the semiconductor laser generates the composite resonator effect realized by the three reflection surfaces: the waveguide end face and the end faces of the semiconductor laser resonator, and the oscillation wavelength are selected by this composite resonator effect. However, since the wavelength to be selected changes with the room temperature and the driving current, the oscillation wavelength varies depending on conditions.

The wavelength selection in the conventional optical head with the mount made of copper or the like metal is described in detail with reference to FIG. 4.

FIG. 4 is a side view of the waveguide type optical head shown in FIG. 3. Assuming the lengths of the semiconductor laser 1 and the waveguide element 8 are $2l_1$ and $2l_2$, respectively, and the distance from the center of the semiconductor laser 1 to the center of the waveguide element 8 is $l_3$, the distance L from the end of the semiconductor laser 1 to the end of the waveguide element 8 is calculated with the following equation:

$$L = l_3 - (l_1 + l_2) \tag{1}$$

The thermal expansion coefficient for the distance L is obtained from the following formula:

$$\frac{1}{L} \cdot \frac{dL}{dT} = \frac{l_3}{L}\left(\frac{1}{l_3} \cdot \frac{dl_3}{dT}\right) - \frac{l_1}{L}\left(\frac{1}{l_1} \cdot \frac{dl_1}{dT}\right) + \tag{2}$$

$$\frac{l_2}{L}\left(\frac{1}{l_2} \cdot \frac{dl_2}{dT}\right) = \frac{1}{l}\left(\frac{dl}{dT}\right)_3 +$$

$$\frac{l_1}{L}\left\{\left(\frac{1}{l} \cdot \frac{dl}{dT}\right)_3 - \left(\frac{1}{l} \cdot \frac{dl}{dT}\right)_1\right\} +$$

$$\frac{l_2}{L}\left(\frac{1}{l} \cdot \frac{dl}{dT_3}\right) - \left(\frac{1}{l} \cdot \frac{dl}{dT_8}\right)$$

The term $$\frac{1}{l} \cdot \frac{dl}{dT_i}$$

(i=1, 3, 8) represents the thermal expansion coefficient of the semiconductor laser 1, the mount 3 or the waveguide element 8. For the proposed conventional head, the coefficient for the mount 3, $$\frac{1}{l}\left(\frac{dl}{dT}\right)_3$$

is $17.0 \times 10^{-6}$, for it is made of copper, the coefficient for the semiconductor laser 1, $$\frac{1}{l}\left(\frac{dl}{dT}\right)_1$$

is $5.9 \times 10^{-6}$, for it is made of GaAs-GaAlAs, and the coefficient for the waveguide element 8, $$\frac{1}{l}\left(\frac{dl}{dT}\right)_8$$

is $2.4 \times 10^{-6}$, for it uses a Si substrate. Normally, $l_1$ is 100 to 200 $\mu$m, $l_2$ is about 5 mm, and L is 5 to 50 $\mu$m. Therefore, since the second and third terms take large values, the thermal expansion coefficient for the distance L as calculated by the expression (2) becomes very large when the room temperature changes. Minor room temperature variation results in a changed construction of the composite resonator, causing the oscillation wavelength of the semiconductor laser to vary.

SUMMARY OF THE INVENTION

In view of the above, an object of the present invention is to provide a waveguide type optical head which suppresses the oscillation wavelength variation of the semiconductor laser.

According to the present invention, a waveguide type optical head comprises a thin film waveguide of semiconductor or dielectric substance formed on a semiconductor or dielectric substrate, an optical element with optical signal processing functions provided on the thin film waveguide, and a semiconductor laser fixed on the substrate for emitting a laser beam into the waveguide, so that part of the laser beam emitted from the semiconductor laser is reflected by the incident end surface of the thin film waveguide and returned to the semiconductor laser.

The semiconductor laser may be formed by epitaxial growth on the semiconductor or dielectric substrate.

The optical signal processing function is optical polarization, optical selection, optical branching, optical composition, optical detection, lens or optical modulation function.

In the waveguide type optical head of the present invention, the light beam reflected from the waveguide end face is returned to the semiconductor laser element to select the oscillation wavelength. With the semiconductor laser and the waveguide being provided on the same semiconductor substrate, any change in the distance between the semiconductor laser and the waveguide is minimized, thereby stabilizing the oscillation wavelength.

According to the present invention, as described above, since the oscillation wavelength of the semiconductor laser is stabilized, it is possible to obtain a waveguide type head of high quality.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

Some embodiments of the present invention will be described in detail with reference to the accompanying drawings.

Figure 1:
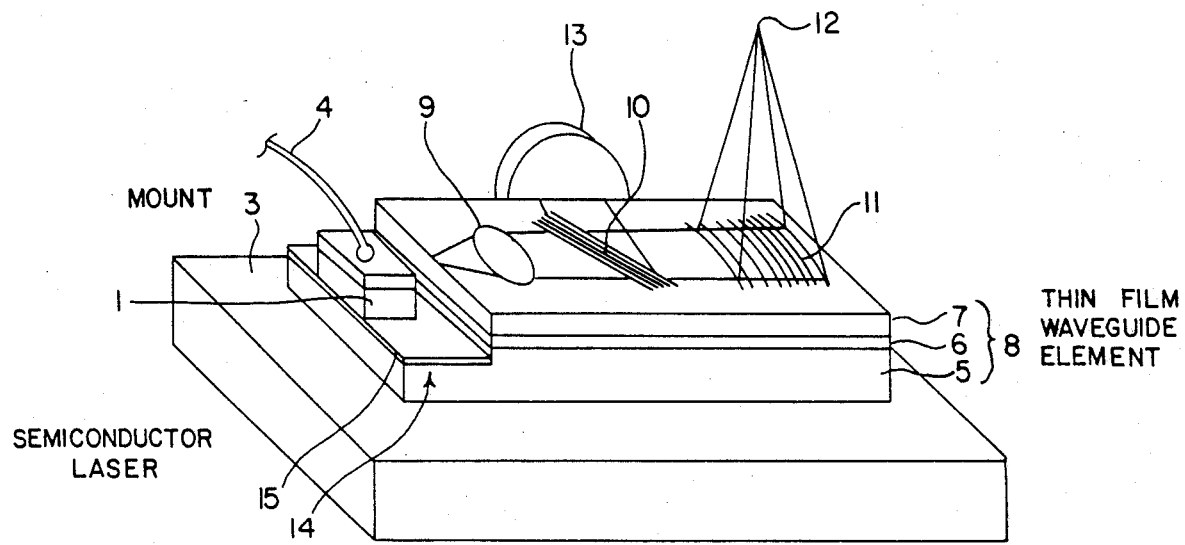
FIGS. 1 and 2 show embodiments of the present invention.

FIG. 1 is a perspective view of an embodiment of the present invention. Elements serving the same functions as those shown in FIG. 3 are designated with the same reference numbers.

A $SiO_2$ buffer layer 6 is formed by oxidation on a Si substrate 5, and a glass waveguide layer 7 is formed by sputtering on the buffer layer 6. A step 14 is formed on an end of the Si substrate 5 by using hydrofluoric acid series etchant and nitric acid series etchant. A collimator lens 9, a beam splitter 10 and a focus grating coupler 11 are formed on the waveguide 7. Here, the collimator lens 9 may be a geodesic lens obtained by forming a round recess in the waveguide 7. The beam splitter 10 for reflecting part of the laser beam is realized by providing an oblique grading on the waveguide. The focus grating coupler 11 is realized by drawing with an electron beam so-called chirped gratings curved and arranged with intervals changing gradually, on a resist film applied on the glass waveguide layer 7, as reported in the Extended Abstracts of the 30th Spring Meeting of the Japan Society of Applied Physics and Related Societies (1983) 4P-J-6. The focal length of the thus obtained focus grating coupler 11 is about 3 mm.

Au and In are sequentially deposited by electron beam on the step 14 of the Si substrate 5 to form a fusion layer 15 on which the semiconductor laser 1 is fixed. The waveguide type optical pickup element thus obtained is secured on a mount 3. The semiconductor laser 1 emits laser beam when current is allowed to flow between the Au wire 4 and the mount 3.

Figure 3:
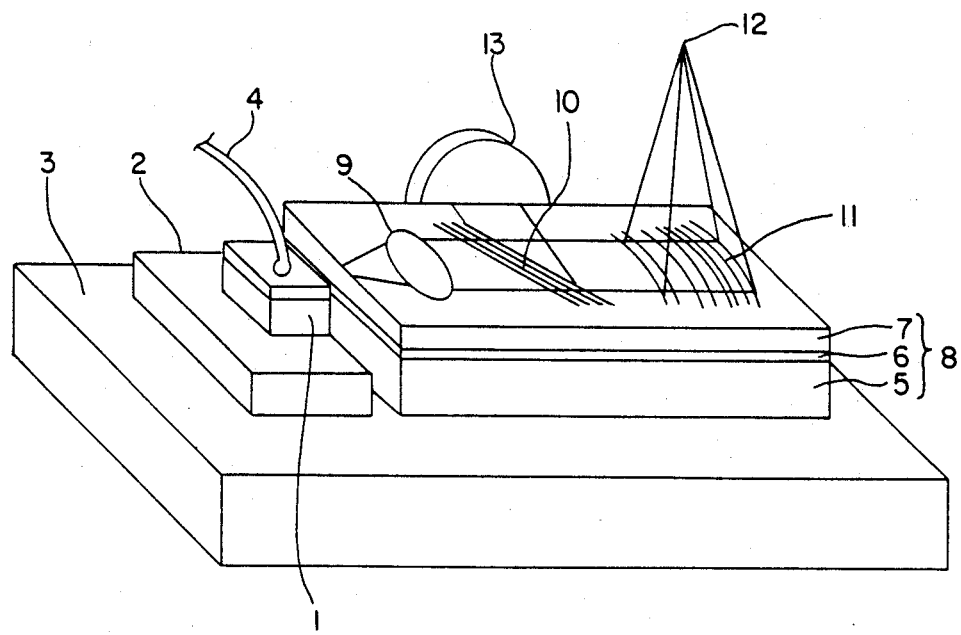
FIG. 3 is a schmatic drawing of the conventional waveguide type pickup.
Figure 4:
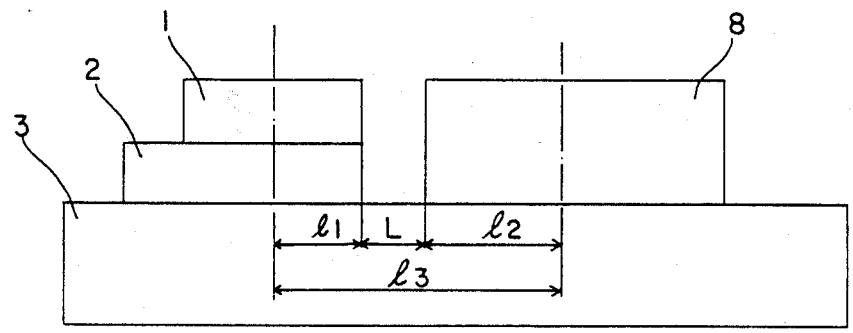
FIG. 4 is a chart for showing the distance between the semiconductor laser and the waveguide element.

Similar to the case in the conventional optical head shown in FIG. 3, a light beam emitted by the semiconductor laser 1 enters the waveguide 7 from one end thereof, is parallelized by the collimator lens 9 and concentrated by the focus grating coupler 11 to a focal point 12 on a disc surface. Light reflected from the point 12 returns through the focus grating coupler 11 into the waveguide and is redirected by the beam splitter 10 to an optical sensor 13 located on one side of the waveguide whereby information recorded on the disc is read. If the optical sensor 13 is of a split type, it is possible to detect focusing error signal and tracking error signal, and it is possible to fix the focal point on the disc by moving the mount 3 by an actuator. According to the present invention, since the semiconductor laser 1 and the waveguide element 8 are formed on the Si substrate 5, $$\frac{1}{l}\left(\frac{dl}{dT}\right)_3 = \frac{1}{l}\left(\frac{dl}{dT}\right)_8 = 2.4 \times 10^{-6}.$$

Accordingly, the third term of the expression (2) for the thermal expansion coefficient for the distance L between the semiconductor laser end and the waveguide end obviously takes a small value, resulting in a small thermal expansion coefficient for L. Part of the laser beam emitted by the semiconductor laser 1 is reflected by the end face of the waveguide element and returned to the semiconductor laser 1 for wavelength selection while variation in the distance L is suppressed. Consequently, the laser beam maintains a stable oscillation wavelength.

The the wavelength selectivity can be improved by forming a highly reflective film on the incident end surface of the waveguide, taking care so that the light output from the focal point 12 does not interfere with the operation of the optical pickup. Alternatively, after GaP/GaAsP distortion super structure and GaAsP-/GaAs distortion super structure are grown by the MOCVD method on the step 14 of the Si substrate 5, a double hetero semiconductor laser of GaAs may be formed integrally on the super structures, as described in the Extended Abstracts of the 46th Autumn Meeting of the Japan Society of Applied Physics (1985) 3P-E-16. In this case, a resonator can be obtained by etching the semiconductor laser end surface with a chemical etching or RIE (reactive ion etching) technique.

A Si substrate is used in the above embodiment although GaAs or other semiconducting material can provide the same effect.

Figure 2:
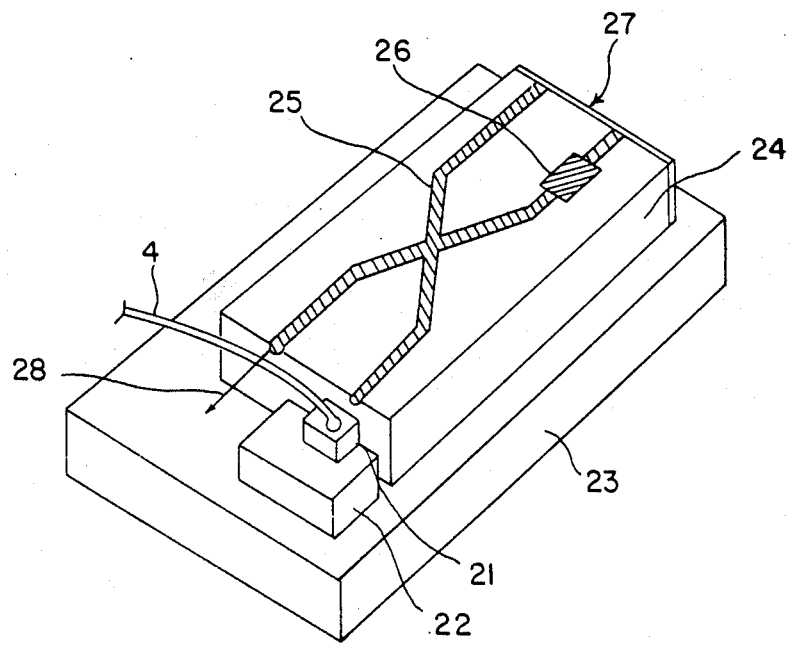

FIG. 2 shows another embodiment of the present invention. A mount 23 comprises a Si substrate. An interference type pressure sensor element 24 made of dielectric LiNbO3 is fixed on the mount 23. A dielectric waveguide 25 with an X shape is formed by Ti diffusion on the LiNbO3 substrate 24. A highly reflective film 27 is formed on one end face of the LiNbO3. A semiconductor laser 21 is fixed on the Si substrate (mount) 23 via a silicon submount 22. Laser beams emitted by the semiconductor laser 21 enter the waveguide 25 while part of the laser beam is reflected by the waveguide end surface and returned to the semiconductor laser.

In the second embodiment as well, the semiconductor laser 21 and the waveguide 25 are formed on the same mount 23, so that change in the distance from the semconductor laser 21 to the waveguide 25 is minimized, resulting in stable oscillation wavelength.

The waveguide 25 with an X shape serves as a Michelson interferometer and generates interference output 28. When pressure is applied to a specified part 26 of the waveguide 25, the phase of the guided light is changed due to the photoelasticity effect. The phase variation is detected in the term of change in the interference output 28. Since pressure is detected on the basis of the interference of the phase of the guided light, wavelength change of the light source gives serious inverse affect on the detection accuracy of the sensor. According to the second embodiment of the present invention, wavelength change of the light source is minimized so that a sensor for accurate detection can be realized.

While only certain embodiments of the present invention have been described, it will be apparent to those skilled in the art that various changes and modifications may be made therein without departing from the spirit and scope of the present invention as claimed.

What is claimed is:

1. A waveguide type optical head comprising:
a substrate formed of a semiconductor or dielectric substance and having a main surface;
a waveguide element formed of a semiconductor or dielectric substance disposed on the main surface of said substrate, said waveguide element having an incident end surface which partially reflects a laser beam;
an optical element having an optical signal processing function disposed on said waveguide element;
a semiconductor laser disposed on the main surface of said waveguide element for emitting a laser beam into said waveguide element, wherein part of the laser beam emitted from said semiconductor laser is reflected by the incident end surface of said waveguide element and returned to said semiconductor laser so as to affect said emitted laser beam, and wherein since said semiconductor laser and said waveguide element are disposed on the main surface of said substrate changes in distance between said laser and said waveguide element due to thermal expansion are suppressed resulting in a stable oscillation wavelength of said laser beam.

2. The optical head of claim 1, further comprising an optical sensor disposed on one side of said waveguide element for reading information, wherein said waveguide element is a thin film waveguide element and comprises a buffer layer formed on said substrate and a waveguide layer formed on said buffer layer, and wherein a fusion layer is formed between said semiconductor laser and said substrate.

3. The optical head of claim 2, wherein said substrate comprises silicon or GaAs.

4. The optical head of claim 2, wherein said optical element comprises a collimator, beam splitter, and a focus grating coupler formed in said waveguide layer.

5. The optical head of claim 4, wherein said substrate comprises silicon, said waveguide layer comprises glass and said buffer layer comprises SiO2.

6. The optical head of claim 5, wherein said fusion layer comprises Au and In.

7. The optical head of claim 1, wherein said waveguide comprises an X-shaped dielectric waveguide which serves as a Michelson interferometer and generates interference output.

8. The optical head of claim 7, wherein said X-shaped dielectric waveguide is formed from Ti diffusion on a LiNbO3 base, and wherein a highly reflective film is formed on waveguide opposite to the incident end surface of said waveguide.

9. The optical head of claim 8, wherein said substrate comprises silicon.

* * * * *